United States Patent [19]
Blair et al.

[11] Patent Number: 5,998,873
[45] Date of Patent: Dec. 7, 1999

[54] LOW CONTACT RESISTANCE AND LOW JUNCTION LEAKAGE METAL INTERCONNECT CONTACT STRUCTURE

[75] Inventors: Christopher S. Blair, San Jose; Irfan A. Saadat, Santa Clara, both of Calif.

[73] Assignee: National Semiconductor Corporation, Santa Clara, Calif.

[21] Appl. No.: 09/213,021

[22] Filed: Dec. 16, 1998

[51] Int. Cl.⁶ .................................................. H01L 29/43
[52] U.S. Cl. .......................................... 257/766; 257/753
[58] Field of Search ................................... 257/751, 753, 257/766, 915

[56] References Cited

U.S. PATENT DOCUMENTS

| | | | |
|---|---|---|---|
| 5,047,367 | 9/1991 | Wei et al. ................................. | 438/683 |
| 5,049,975 | 9/1991 | Ajika et al. .............................. | 257/382 |
| 5,236,852 | 8/1993 | Cherniawski et al. ................... | 438/683 |
| 5,514,622 | 5/1996 | Bornstein et al. . | |
| 5,536,684 | 7/1996 | Dass et al. ............................... | 438/683 |
| 5,565,708 | 10/1996 | Ohsaki et al. ........................... | 257/751 |
| 5,780,362 | 7/1998 | Wang et al. .............................. | 438/683 |

OTHER PUBLICATIONS

Maex, K, et al; Self–Aligned Silicides for ULSI, Mat. Res Soc. Symp. Proc. vol. 260 pp. 133–144 (1992).

*Primary Examiner*—David B. Hardy
*Attorney, Agent, or Firm*—Limbach & Limbach L.L.P.

[57] ABSTRACT

A low contact resistance and low junction leakage metal interconnect contact structure for use with ICs. The contact structure includes an interconnect dielectric material layer on the surface of an IC semiconductor substrate. The interconnect dielectric material layer has a contact opening which extends to a predetermined region of the semiconductor substrate (e.g. a source region, drain region, or polysilicon gate layer). The contact structure also includes a cobalt (or nickel) silicide interface layer on the surface of the predetermined region that is aligned with the bottom of the contact opening, a cobalt (or nickel) adhesion layer on the sidewall surface of the contact opening, a refractory metal-based barrier layer on the metal adhesion layer and the metal silicide interface layer, and a conductive plug. Manufacturing process steps for such a contact structure include first providing a semiconductor substrate with at least one predetermined region (e.g. a drain region, source region or polysilicon gate layer), followed by depositing an interconnect dielectric material layer on the surface of the semiconductor substrate. Contact openings are formed through the interconnect dielectric material layer to expose the predetermined region. A cobalt (or nickel) adhesion layer is then deposited, followed by the deposition of a refractory metal-based barrier layer, and the reaction of cobalt (or nickel) from the adhesion layer with silicon from the exposed predetermined region to form a metal silicide interface layer. Finally, a conductive plug layer is deposited on the barrier layer, filling the contact opening.

9 Claims, 6 Drawing Sheets

LOW CONTACT RESISTANCE AND LOW JUNCTION LEAKAGE METAL INTERCONNECT CONTACT STRUCTURE

BACKGROUND OF THE INVENTION

1. Field of the Invention

The present invention relates to integrated circuit structures and, in particular, to metal interconnect contact structures for use in integrated circuits and processes for their manufacture.

2. Description of the Related Art

Typical integrated circuits (ICs) include metal interconnect structures that serve a variety of purposes, such as carrying electrical signals between individual device elements in the IC, supplying power, and providing a connection to ground and to external apparatus.

Figure 1:
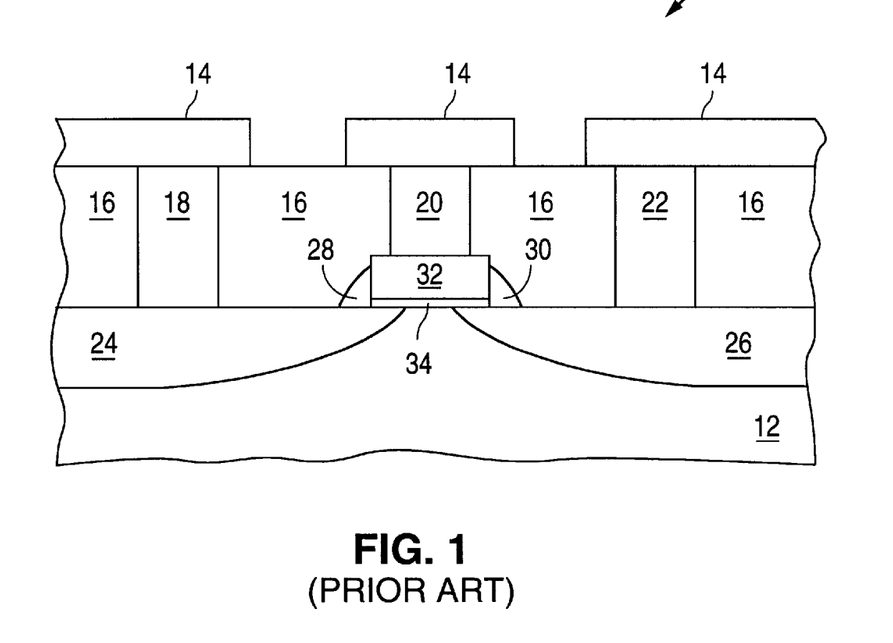
FIG. 1 is a cross-sectional view illustrating a conventional metal interconnect structure.

FIG. 1 illustrates a basic metal interconnect structure 10 disposed above a semiconductor substrate 12. Metal interconnect structure 10 includes patterned metal layer 14, interconnect dielectric material layer 16, and contacts 18, 20 and 22. Semiconductor substrate 12 has a conventional MOS transistor formed on its surface that includes source region 24, drain region 26, gate sidewall spacers 28 and 30, polysilicon gate layer 32 and gate oxide layer 34. The contacts 18, 20 and 22 of metal interconnect structure 10 provide an electrical connection between the patterned metal layer 14 and various parts of the MOS transistor: the source region 24, polysilicon gate layer 32 and drain region 26, respectively.

Figure 2:
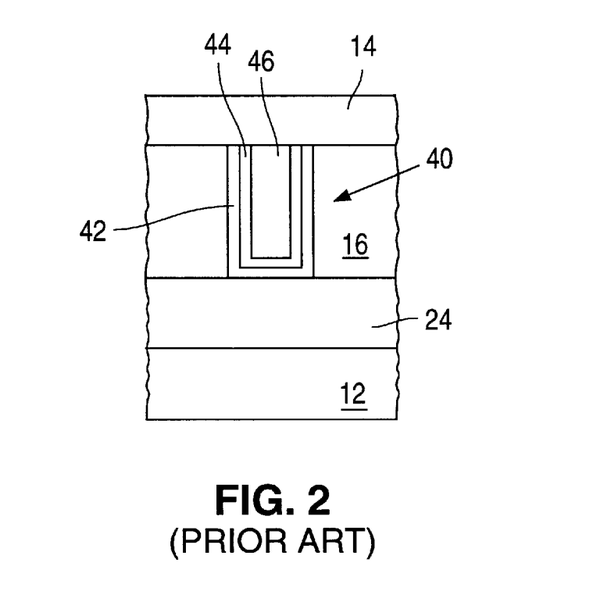
FIG. 2 is a cross-sectional view depicting a conventional metal interconnect contact that includes titanium and refractory metal-based barrier layers.

FIG. 2 illustrates a conventional and more elaborate design of a metal interconnect contact 40, which includes a first metallic layer 42, a second metallic layer 44 and a center plug (i.e. core) 46. See U.S. Pat. No. 5,514,622 to Bornstein et al., which is hereby fully incorporated by reference, for a further description of metal interconnect structures in general. The first metallic layer 42 of the metal interconnect contact 40 is conventionally a titanium adhesion layer, while the second metallic layer 44 is a titanium-nitride (TiN) layer. The center plug 46 is typically formed of tungsten (W). Standard tungsten plug deposition processes employ $WF_6$. The presence of a TiN layer in the metal interconnect contact acts as a barrier layer to prevent $WF_6$ from reacting with silicon from the source region, drain region or the polysilicon gate layer during the tungsten plug deposition process. The use of a Ti layer in the metal interconnect contact is designed to improve the adhesion of the TiN layer to the Ti layer, as well as the adhesion of the W plug to the TiN layer. The presence of the Ti layer in the metal interconnect contact also improves the contact resistance between the patterned metal layer and the various parts of the MOS transistor, namely the source region, polysilicon gate layer and drain region.

The Ti and TiN layers employed in metal interconnect contacts are often subjected to a thermal annealing process to further improve contact resistance. This is normally done using rapid thermal annealing (RTA) equipment at temperatures in the range of 600° C. to 700° C. The data in Table 1 below show the effect of such an RTA process, namely that contact resistance is inversely proportional to the temperature of the RTA process. Therefore, as the temperature increases, the contact resistance advantageously decreases.

TABLE 1

| RTA Temperature | Average Patterned Metal to Polysilicon Contact Resistance |
|---|---|
| No RTA | 3.9 ohms/square |
| 600° C. | 2.9 ohms/square |
| 650° C. | 2.6 ohms/square |
| 700° C. | 2.3 ohms/square |

An increase in the temperature of the RTA process, however, also increases the junction leakage of the P+ source and/or drain, which is detrimental to integrated circuit device characteristics. This effect of the RTA process temperature on the junction leakage is indicated by the data in Table 2 below.

TABLE 2

| RTA Temperature | Average P+ Junction Leakage log (amps) |
|---|---|
| No RTA | −10.3 |
| 600° C. | −9.9 |
| 650° C. | −9.3 |
| 700° C. | −9.0 |

Still needed in the art is a metal interconnect contact, and process for its manufacture, that provides for both low contact resistance and low junction leakage. In addition, the process for its manufacture should be compatible with standard integrated circuit manufacturing techniques.

SUMMARY OF THE INVENTION

The metal interconnect contact structure for use in integrated circuits according to the present invention provides for a low contact resistance between a patterned metal layer and MOS transistor parts. It also provides for low junction leakage in the associated integrated circuit (IC). The metal interconnect contact structure in accordance with the present invention includes an interconnect dielectric material layer (typically $SiO_2$) on the surface of the IC's semiconductor substrate. The interconnect dielectric material layer has a contact opening which extends from its upper surface to a predetermined region of the semiconductor substrate, such as a source region, drain region and polysilicon gate layer of an MOS transistor. The metal interconnect contact structure according to the present invention also includes a metal silicide interface layer disposed on the surface of the predetermined region of the semiconductor substrate that is aligned with the bottom of the contact opening. The metal silicide interface layer provides the desired low contact resistance and can be either a cobalt silicide interface layer or a nickel silicide interface layer with a thickness in the range of 100 angstroms to 500 angstroms. The metal interconnect contact structure further includes a metal adhesion layer disposed on the sidewall surface of the contact opening. A refractory metal-based barrier layer disposed on the surface of both the metal adhesion layer and the metal silicide interface layer, as well as a conductive plug (e.g. a tungsten plug) that fills the remainder of the contact opening, are also parts of the metal interconnect contact structure in accordance with the present invention. The refractory metal-based barrier layer can be made of titanium-nitride (TiN), tantalum-nitride (TaN), Tungsten-nitride (WN), titanium-tungsten (TiW) or a combination of these materials.

The present invention also provides a process for the formation of a low contact resistance and low junction leakage metal interconnect contact structure for use in integrated circuits. The process steps include first providing a semiconductor substrate having at least one predetermined region (e.g. a drain region, source region or polysilicon gate layer of an MOS transistor), followed by depositing an interconnect dielectric material layer on the surface of the semiconductor substrate. At least one contact opening is then formed through the interconnect dielectric material layer to expose a predetermined region. Next, a metal adhesion layer (either cobalt or nickel) is deposited on the surface of the interconnect dielectric material layer, the sidewall of the contact opening and the exposed predetermined region. A refractory metal-based barrier layer is then deposited on the surface of the metal adhesion layer, followed by reacting metal from the metal adhesion layer with silicon from exposed predetermined region in order to form a metal silicide interface layer. Since the metal adhesion layer is formed of either cobalt or nickel, the metal silicide interface layer that results from the reaction is either a cobalt silicide interface layer or a nickel silicide interface layer.

Finally, a conductive plug layer is deposited on the surface of the refractory metal-based barrier layer, thereby filling the remainder of the contact opening. Since a nickel silicide interface layer and a cobalt silicide interface layer can be formed at relatively low temperatures (e.g. in the range of 450° C. to 500° C.), IC junction leakage is not increased by processes according to the present invention.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

Figure 3:
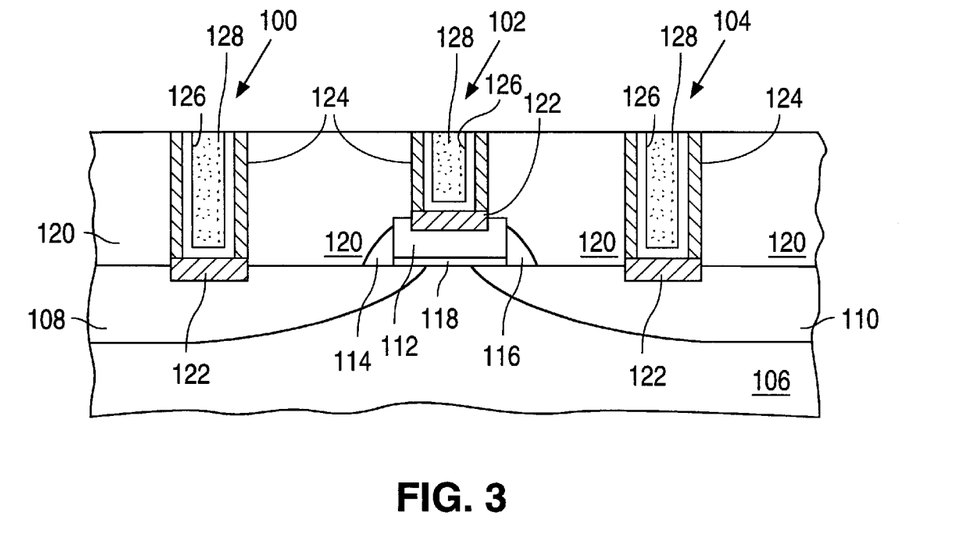
FIG. 3 is a cross-sectional view illustrating a low contact resistance and low junction leakage contact structure in accordance with the present invention.

FIG. 3 illustrates low contact resistance and low junction leakage metal interconnect contact structures 100, 102 and 104 according to the present invention employed with an MOS transistor formed on a surface of a semiconductor substrate 106 (i.e. a silicon-based substrate). The MOS transistor includes source region 108, drain region 110, polysilicon gate layer 112, gate sidewall spacers 114 and 116, and gate oxide layer 118, all formed by processes known in the art. Each of the metal interconnect contact structures 100, 102 and 104 share an interconnect dielectric material layer 120 that overlies semiconductor substrate 106. Interconnect dielectric material layer 120 is typically formed of silicon dioxide ($SiO_2$) or silicon nitride, although other suitable dielectric materials are also known in the art. Interconnect dielectric material layer 120 includes three (3) contact openings that extend from the upper surface of the interconnect dielectric material layer to predetermined regions (i.e. source region, drain region and polysilicon gate layer) of the semiconductor substrate. One of the three contact openings extends to the source region 108 of the MOS transistor to form a part of the metal interconnect contact structure 100, as illustrated in FIG. 3. Similarly, another contact opening extends to the drain region 110 of the MOS transistor to form a part of the metal interconnect contact structure 104, while yet another contact opening extends to the polysilicon gate layer 112 to form a part of the metal interconnect contact structure 102.

Each of the metal interconnect contact structures 100, 102 and 104 also includes a metal silicide interface layer 122 aligned with the bottom of the contact opening. The metal silicide interface layer 122 of the metal interconnect contact structure 100 is in contact with, and formed in, source region 108 of the MOS transistor, while the metal silicide interface layer 122 of the metal interconnect contact structures 102 and 104 are in contact with, and formed in, the polysilicon gate layer 112 and drain region 110 of the MOS transistor, respectively. Metal silicide interface layer 122 can be formed of either cobalt silicide or nickel silicide, and has a typical thickness in the range of 100 angstroms to 500 angstroms. The presence of a metal silicide interface layer 122 provides a metal interconnect contact structure with low contact resistance. Nickel or cobalt are used in the metal silicide interface layers since their respective silicides can be formed at relatively low temperatures, thereby avoiding substantial increases in junction leakage.

Each of the metal interconnect contact structures 100, 102 and 104 also include a metal adhesion layer 124 disposed on the sidewall surface of the contact openings. When a cobalt silicide interface layer is employed, metal adhesion layer 124 is a cobalt adhesion layer, whereas when a nickel silicide interface layer is used, metal adhesion layer 124 is a nickel adhesion layer. The thickness of the metal adhesion layer is typically in the range of 75 angstroms to 300 angstroms. The metal interconnect contact structures also include a refractory metal-based barrier layer 126 (e.g. TiN) disposed on the surface of the metal adhesion layer 124, as well as a conductive plug 128 (e.g. a tungsten plug) that fills the remainder of the contact openings.

Figure 4:
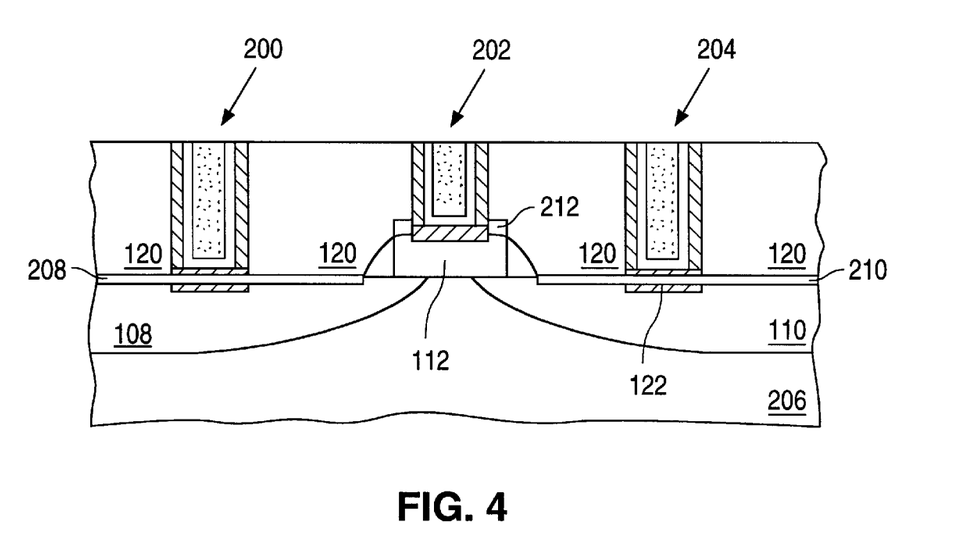
FIG. 4 is a cross-sectional view illustrating a low contact resistance and low junction leakage metal interconnect contact structure according to the present invention employed with a MOS transistor that includes a salicided source region, a salicided drain region, and a salicided polysilicon gate layer.

The use of a cobalt or nickel silicide interface layer on the bottom of the metal interconnect contact structure that is in direct contact with the predetermined regions provides a low contact resistance metal interconnect contact structure that can be manufactured without high temperature processing steps, thereby avoiding an increase injunction leakage.

Where a MOS transistor includes, as it commonly does, self-aligned silicide (i.e. salicide) layers on the upper surfaces of its source region, drain region and polysilicon gate layer, the metal interconnect contact structure according to the present invention still provides for relatively low contact resistance and low junction leakage by furnishing an additional metal silicide interface layer at the bottom of the contact openings. This metal silicide interface layer is especially beneficial in the case where a contact opening extends to a salicided polysilicon gate layer, since a part (or all) of the salicide layer disposed on the polysilicon gate layer is usually removed upon the formation of such contact openings. This partial or complete removal of the salicide layer is due to the fact that there is ordinarily less overlying interconnect dielectric material layer present on the polysilicon gate layer than the source region or drain region within the same MOS transistor. FIG. 4 illustrates metal interconnect contact structures 200, 202 and 204, all according to the present invention, where the metal interconnect contact structures have been manufactured above a semiconductor substrate 206 that includes an MOS transistor with salicided source and drain regions, as well as a salicided polysilicon gate layer. The MOS transistor depicted in FIG. 4 includes an additional source salicide layer 208, drain salicide layer 210 and polysilicon gate salicide layer 212. These salicide layers can be formed of any metal silicide known in the art, such as titanium silicide, cobalt silicide, tungsten silicide and nickel silicide.

Figure 5:
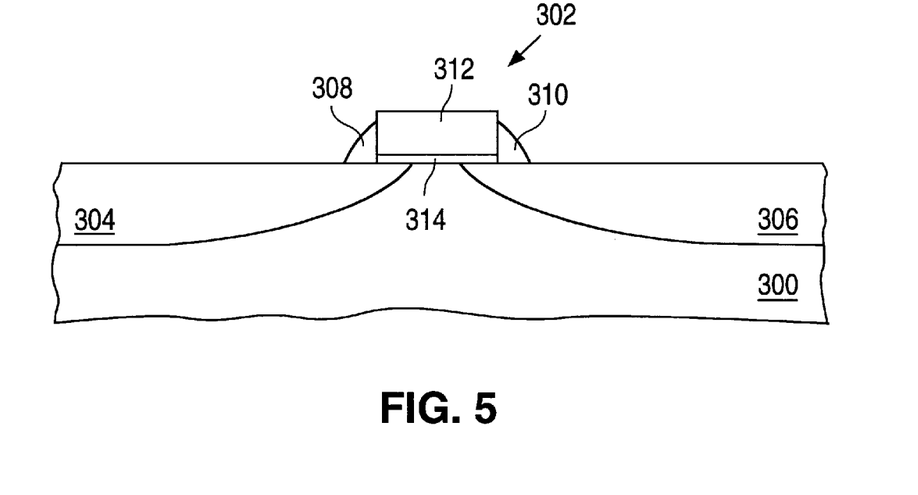
FIGS. 5–11 are cross-sectional views illustrating stages in a process in accordance with the present invention.
Figure 6:
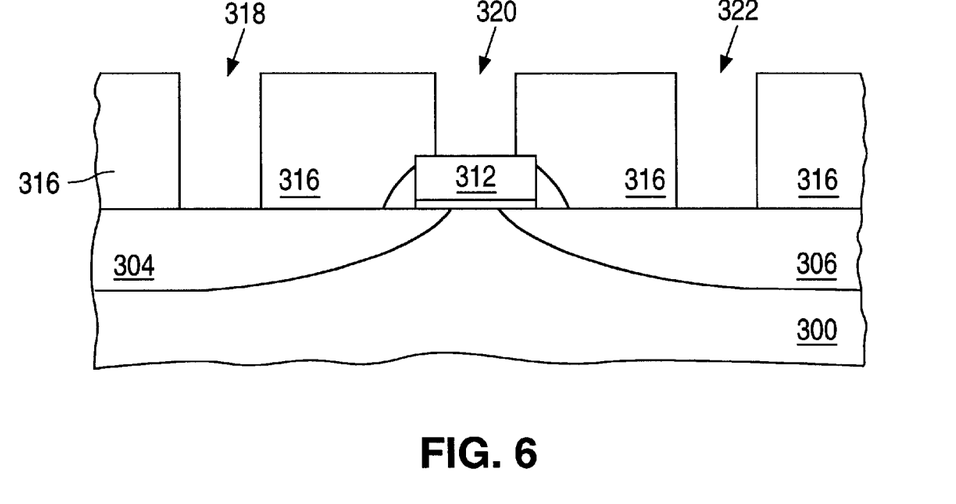

The present invention also provides a manufacturing process for a low contact resistance and low junction leakage metal interconnect structure for use in integrated circuits. FIGS. 5 through 11 illustrate various stages of such a manufacturing process. The process steps according to the present invention include first providing a semiconductor substrate 300 (i.e. a silicon-based substrate) with a MOS transistor 302 disposed on its surface, as shown in FIG. 5. The MOS transistor 302 includes a source region 304, drain region 306, gate sidewall spacers 308 and 310, polysilicon gate layer 312 and gate oxide layer 314. An interconnect dielectric material layer 316, typically formed of silicon dioxide ($SiO_2$) and about 1 micron in thickness, is then deposited over the surface of the MOS transistor. Contact openings 318, 320 and 322 (e.g. 0.3 microns in diameter) are subsequently formed in the interconnect dielectric material layer 316 using, for example, conventional photolithographic and anisotropic etching techniques. Each of the contact openings extends through the interconnect dielectric material layer, exposing a predetermined region of the semiconductor substrate. The resultant structure is illustrated in FIG. 6.

Figure 7:
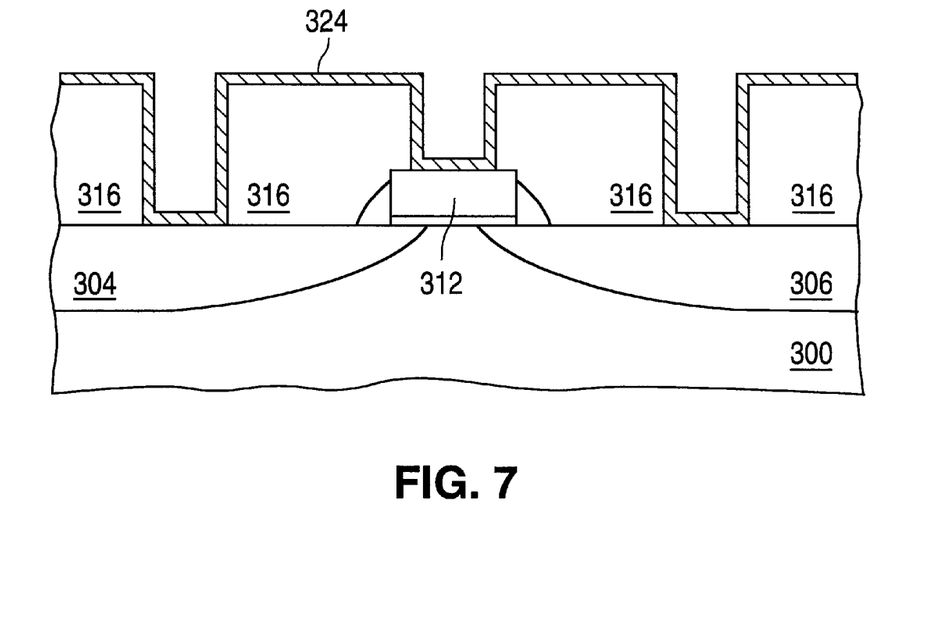

Next a metal adhesion layer 324, of either cobalt or nickel, is deposited over the surface the interconnect dielectric material layer 316, the sidewall surfaces of the contact openings, and the exposed predetermined regions of the semiconductor substrate. Since the portion of the metal adhesion layer 324 that overlies the predetermined regions of the semiconductor substrate is a precursor to either cobalt or nickel silicide interface layers, metal adhesion layer 324 must be either a cobalt adhesion layer or a nickel adhesion layer. Metal adhesion layer 324 has a typical thickness in the range of 75 angstroms to 300 angstroms, with a preferred thickness of 100 angstroms, and can be deposited by sputtering-based physical vapor deposition (PVD). The resultant structure is depicted in FIG. 7.

Figure 8:
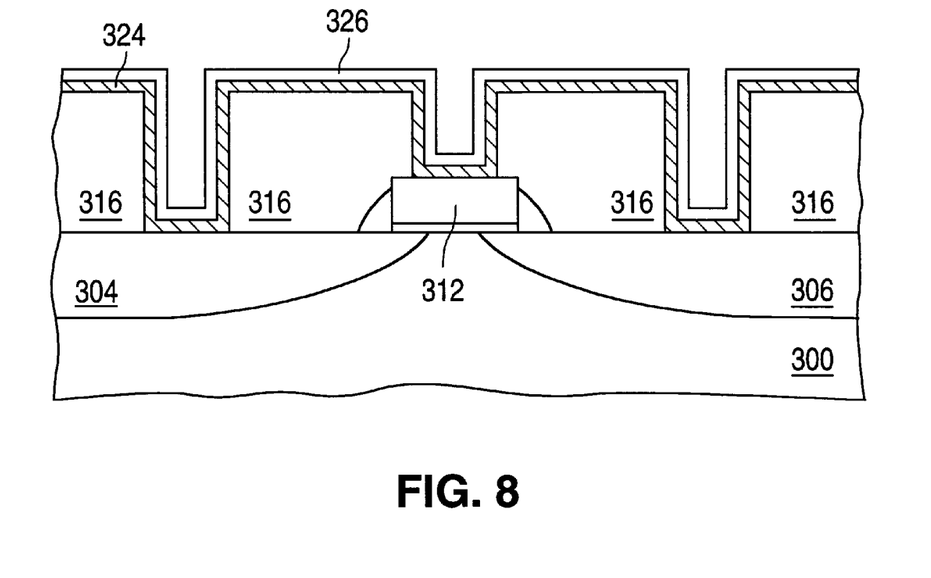

Next, a refractory metal-based barrier layer 326 is deposited on the surface of the metal adhesion layer 324, typically using chemical vapor deposition (CVD) techniques known in the art. The thickness of the TiN layer is generally in the range of 100 angstroms to 400 angstroms with a preferred thickness in the range of 100 angstroms to 200 angstroms. The resultant structure is illustrated in FIG. 8.

Figure 9:
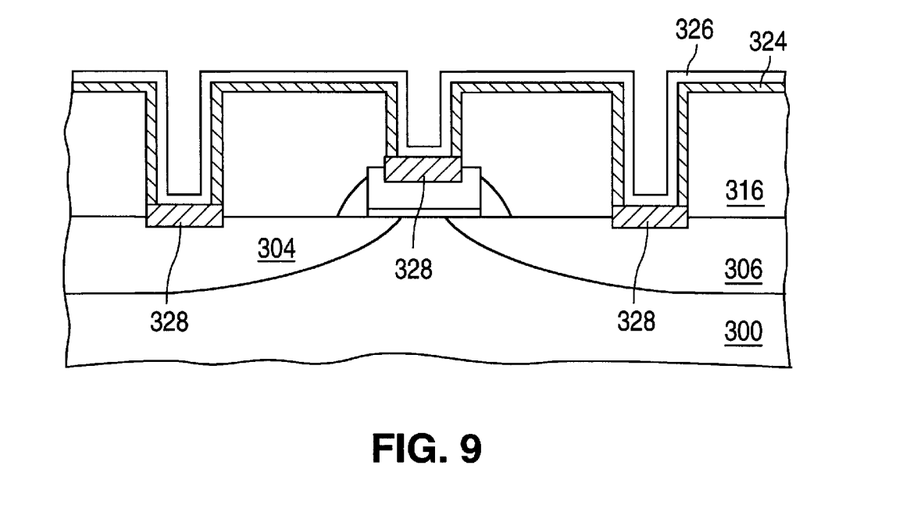

Metal (either cobalt or nickel) from the metal adhesion layer 324 is then reacted with silicon from the predetermined regions, namely source region 304, drain region 306 and polysilicon gate layer 312, of the semiconductor substrate to form metal (either cobalt or nickel) silicide interface layers 328 in these regions. The thickness of the metal silicide interface layer 328 is typically in the range of 100 angstroms to 500 angstroms. The resultant structure is shown in FIG. 9. The metal silicide interface layer reaction conditions (such as temperature and gaseous ambient) employed are selected with three objectives in mind: (1) to foster the reaction of the metal from the metal adhesion layer with silicon from these predetermined regions; (2) to impede reaction of the metal adhesion layer with the interconnect dielectric material layer; and (3) to avoid a significant increase injunction leakage. In controlling junction leakage, it is critical to maintain the reaction at a relatively low temperature, for example, in the rage of 450° C. to 500° C. The metal silicide interface layer reaction step can be conducted in a rapid thermal processor (RTP), using either a nitrogen or ammonia ambient for a period of 30 seconds to 2 minutes. See Karen Maex and Rob Schreutelkamp, Self-Aligned Silicides for ULSI in Mat. *Res. Soc. Symp. Proc.*, Vol. 260, 133–144 (1992), which is hereby fully incorporated by reference, for a more detailed discussion of cobalt silicide reaction conditions. A significant increase in junction leakage generally occurs when relatively high reaction temperatures, in the range of 600° C. to 700° C. or higher, are used. The process according to the present invention employs either a cobalt layer or a nickel layer as the metal adhesion layer, since these layers can be converted to a nickel silicide interface layer and a cobalt silicide interface layer, respectively, at a relatively low reaction temperature, thereby avoiding a significant increase in junction leakage.

Figure 10:
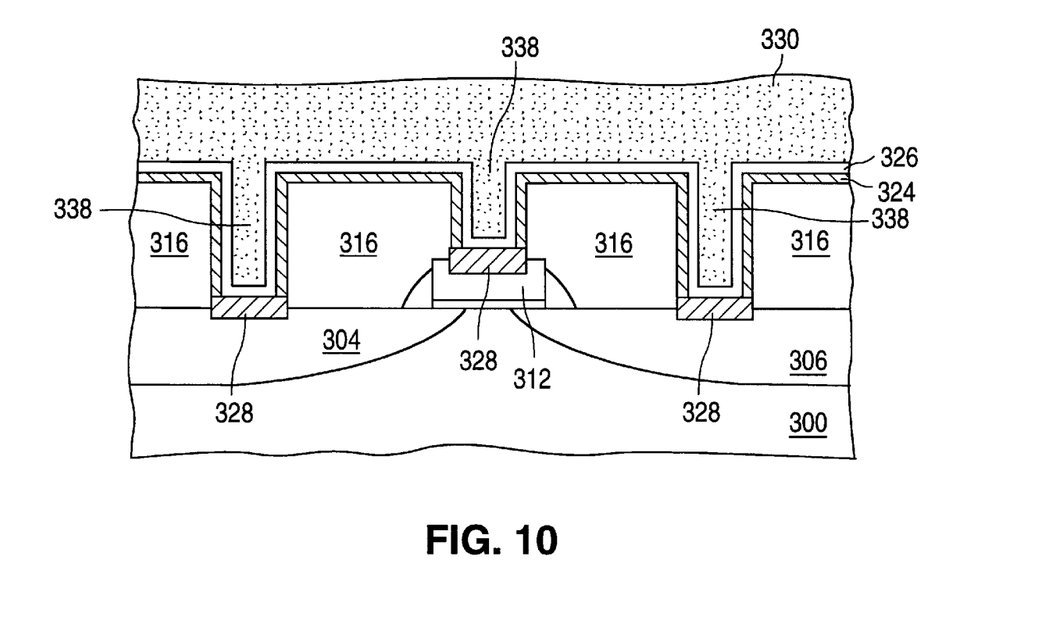

Next, a conductive plug layer 330, typically a tungsten plug layer, is deposited on the surface of the TiN layer 326, filling the remainder of the contact openings 318, 320 and 322 to form a conductive plug 338. The conductive plug layer 330 can be formed by conventional CVD techniques. The thickness of the conductive plug layer 330 should be greater than one half the width of the contact openings, in order to insure that they are completely filled. A typical thickness would be in the vicinity of 3500 angstroms. The resultant structure is illustrated in FIG. 10.

Figure 11:
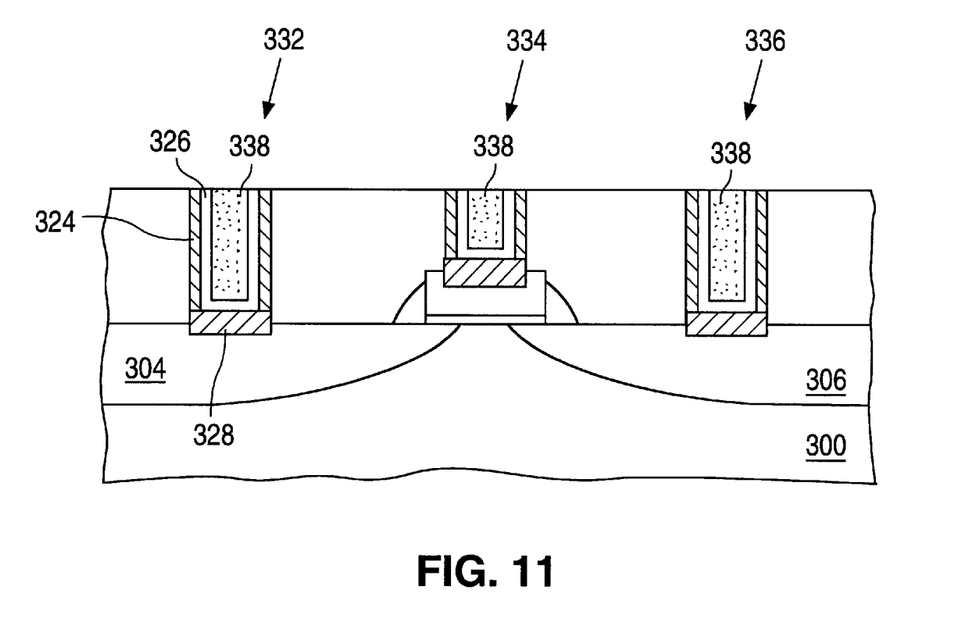

Next, all of the conductive plug layer 330, the refractory metal-based barrier layer 326, and the metal adhesion layer 324 are removed from the upper surface of the interconnect dielectric material layer 316, except those portions of the conductive plug layer that filled the contact opening (i.e. conductive plug 338), the metal adhesion layer that is disposed on the sidewalls of the contact openings, and the refractory metal-based barrier layer that is disposed within the contact openings. This removal step can be accomplished, for example, through the use of Chemical Mechanical Polishing (CMP) techniques. The resultant low contact resistance and low junction leakage metal interconnect contact structures 332, 334 and 336, illustrated in FIG. 11, are equivalent to those of FIG. 3. In a typical IC manufacturing process, additional patterned metal layer formation steps, dielectric material layer deposition steps, and via formation steps would follow in a fashion known to those skilled in the art.

Although the process according to the present invention has been described in conjunction with a semiconductor substrate that includes a MOS transistor without a salicided source region, salicided drain region and a salicided polysilicon gate layer, the process can also be employed in conjunction with MOS transistors that include these salicide layers or polycide layers. The resulting structure from the process employed in conjunction with such a salicided source region, a salicide drain region and a salicided polysilicon gate layer is equivalent to that illustrated in FIG. 4.

It should be understood that various alternatives to the embodiments of the invention described herein may be employed in practicing the invention. It is intended that the following claims define the scope of the invention and that structures and processes within the scope of these claims and their equivalents be covered thereby.

What is claimed is:

1. A low contact resistance and low junction leakage metal interconnect contact structure for use in integrated circuits that include a semiconductor substrate, the metal interconnect contact structure comprising:

an interconnect dielectric material layer disposed on the surface of the semiconductor substrate, the interconnect dielectric material layer having at least one contact opening therethrough that extends from an upper surface of the interconnect dielectric material layer to a predetermined region of the semiconductor substrate;

a cobalt silicide interface layer disposed on the surface of the predetermined region of the semiconductor substrate and aligned with the bottom of the contact opening;

a cobalt adhesion layer disposed on the sidewall surface of the contact opening;

a refractory metal-based barrier layer disposed on the surfaces of the cobalt adhesion layer and the cobalt silicide interface layer; and a conductive plug filling the contact opening.

2. The metal interconnect contact structure of claim 1 wherein the cobalt silicide interface layer has a thickness in the range of 100 angstroms to 500 angstroms and the cobalt adhesion layer has a thickness in the range of 75 angstroms to 300 angstroms.

3. The metal interconnect contact structure of claim 1 wherein the refractory metal-based barrier layer is selected from the group consisting of titanium-nitride, tantalum-nitride, tungsten-nitride, titanium-tungsten and combinations thereof.

4. The metal interconnect contact structure of claim 1 wherein the conductive plug is a tungsten plug.

5. The metal interconnect contact structure of claim 1 wherein the predetermined region of the semiconductor substrate is a semiconductor device region selected from the group consisting of an MOS transistor source region, an MOS transistor drain region and an MOS transistor polysilicon gate layer.

6. A low contact resistance and low junction leakage metal interconnect contact structure for use in integrated circuits that include a semiconductor substrate, the metal interconnect contact structure comprising:

an interconnect dielectric material layer disposed on the surface of the semiconductor substrate, the interconnect dielectric material layer having at least one contact opening therethrough that extends from an upper surface of the interconnect dielectric material layer to a predetermined region of the semiconductor substrate;

a nickel silicide interface layer disposed on the surface of the predetermined region of the semiconductor substrate and aligned with the bottom of the contact opening;

a nickel adhesion layer disposed on the sidewall surface of the contact opening;

a refractory metal-based barrier layer disposed on the surfaces of the nickel adhesion layer and the nickel silicide interface layer; and a conductive plug filling the contact opening.

7. The metal interconnect contact structure of claim 6 wherein the refractory metal-based barrier layer is selected from the group consisting of titanium-nitride, tantalum-nitride, tungsten-nitride, titanium-tungsten and combinations thereof.

8. The metal interconnect contact structure of claim 6 wherein the conductive plug is a tungsten plug.

9. The metal interconnect contact structure of claim 6 wherein the predetermined region of the semiconductor substrate is a semiconductor device region selected from the group consisting of an MOS transistor source region, an MOS transistor drain region and an MOS transistor polysilicon gate layer.

* * * * *